(12) United States Patent
Chen

(10) Patent No.: US 9,147,444 B1
(45) Date of Patent: Sep. 29, 2015

(54) VOLTAGE REGULATOR

(71) Applicant: ELITE SEMICONDUCTOR MEMORY TECHNOLOGY INC., Hsinchu (TW)

(72) Inventor: Chung-Zen Chen, Hsinchu (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 0 days.

(21) Appl. No.: 14/222,024

(22) Filed: Mar. 21, 2014

(51) Int. Cl.
*G11C 7/06* (2006.01)
*G11C 5/14* (2006.01)
*G11C 7/22* (2006.01)

(52) U.S. Cl.
CPC . *G11C 5/147* (2013.01); *G11C 7/22* (2013.01)

(58) Field of Classification Search
CPC ...... G11C 5/147; G11C 11/4074; G11C 5/14; G11C 7/12; G11C 11/406; G11C 11/40615; G11C 2211/4068; G11C 5/143; G11C 5/145; G11C 7/02; G11C 7/06
USPC ............... 365/189.09, 226, 227, 189.07, 100, 365/175, 179, 189.15, 196
See application file for complete search history.

(56) References Cited

U.S. PATENT DOCUMENTS

2010/0194412 A1* 8/2010 Cho ............................. 324/705

* cited by examiner

*Primary Examiner* — Thong Q Le
(74) *Attorney, Agent, or Firm* — Li & Cai Intellectual Property (USA) Office

(57) ABSTRACT

A voltage regulator including an over-drive circuit and a control circuit is illustrated. The over-drive circuit receives a first voltage signal output from a sensing amplifier in a DRAM circuit, and regulates the first voltage signal according to an over-drive signal. The a control circuit electrically connected to the over-drive circuit receives a sense signal, and outputs the over-drive signal according to the sense signal, wherein the sense signal is asserted when a bit line in the DRAM circuit is sensed that an restoring and operation is performed. The over-drive signal goes down to a level of a second voltage signal from a current level thereof dependent on an external power merely when the sense signal is asserted but has not been asserted for a delay time, or otherwise, the over-drive signal is equal to the external power.

13 Claims, 3 Drawing Sheets

VOLTAGE REGULATOR

BACKGROUND

1. Technical Field

The present invention relates to a voltage regulator, and more particularly to a voltage regulator for semiconductor memories such as dynamic random access memory (DRAM).

2. Description of Related Art

Along with the rapid development of science and technology at the present, semiconductor memories, as major storage devices for large amount of data are being developed to have larger and larger capacity. As the semiconductor technology is continuously scaled down to achieve high memory density, on-chip voltage regulators providing lower supply voltage for internal circuits are required to fulfill the requirements for device reliability and low power consumption. For DRAM, the bit line sensing, restoring operation in the memory cell arrays consume current abruptly and heavily. For high density DRAM chip, it is challenging to design on-chip voltage regulators for memory cell arrays providing a stable voltage level (such as VCCSA) with sufficient and appropriate supplying current.

The bit line sense amplifier will be activated when the bit line signal is large enough. The latch nodes connected to the bit line (BL) and the bit line bar (BLB) of the memory cell are sensing to the voltage signals VCCSA and VSS, such that the memory cell can be restored to the voltage signal VCCSA or VSS. However, during sensing, the voltage signal VCCSA will be dropped since the voltage signal VCCSA is used to charges up the bit line or the bit line bar from the plate voltage VCP to the voltage signal VCCSA. If the voltage signal VCCSA drops too low, the sense amplifier will have a stable issue, and thus the data will flip.

An over-drive (or kick) design is used to supply the voltage signal VCCSA besides from the sensing amplifier, and avoid the data flip. Unfortunately, the over-drive design may provide the too strong or weak voltage signal VCCSA since the voltage signal VCCSA comes from an external power VDD having a variation from the maximum and minimum levels of the external power VDD. In circuit design, there is larger margin to cover, and the external power VDD will be larger than the maximum level and lower than the minimum level of the external power VDD. Therefore, the duration to provide the over-drive also affects the voltage signal VCCSA.

SUMMARY

An exemplary embodiment of the present disclosure provides a voltage regulator including an over-drive circuit and a control circuit. The over-drive circuit receives a first voltage signal output from a sensing amplifier in a DRAM circuit, and regulates the first voltage signal according to an over-drive signal. The a control circuit electrically connected to the over-drive circuit receives a sense signal, and outputs the over-drive signal according to the sense signal, wherein the sense signal is asserted when a bit line in the DRAM circuit is sensed that an restoring and operation is performed. The over-drive signal goes down to a level of a second voltage signal from a current level thereof dependent on an external power merely when the sense signal is asserted but has not been asserted for a delay time, or otherwise, the over-drive signal is equal to the external power.

According to an exemplary embodiment of the present disclosure, the over-drive circuit comprises a voltage divider, a comparator, a first PMOS transistor, and a second PMOS transistor. The voltage divider outputs a divided voltage signal according to the first voltage signal. The comparator compares the divided voltage signal and a reference voltage signal to output a comparison signal. A gate of first PMOS transistor receives the comparison signal, a source of first PMOS transistor is electrically connected to the external power, and a drain of first PMOS transistor is electrically connected to the first voltage signal. A gate of a second PMOS transistor receives the over-drive signal, a source of a second PMOS transistor is electrically connected to the external power, and a drain of a second PMOS transistor is electrically connected to the first voltage signal.

According to an exemplary embodiment of the present disclosure, the control circuit comprises a delay unit, an inverter, an AND gate, a first NMOS transistor and a third PMOS transistor. The delay unit delays the sense signal the delay time to output the delayed sense signal. The inverter inverts the delayed sense signal to output an inverted delayed sense signal. The AND gate performs a logical AND operation on the sense signal and the delayed sense signal to output a pulse over-drive signal. A gate of the first NMOS transistor receives the pulse over-drive signal, and a source of the first NMOS transistor is grounded. A gate of the third PMOS transistor is grounded, and a source of the third PMOS transistor is electrically connected the external power. Drains of the first NMOS transistor and the third PMOS transistor are electrically connected to each other to output the over-drive signal, and a driving ability of the first NMOS transistor is larger than a driving ability of the third PMOS transistor.

To sum up, the voltage regulator can prevent the too strong or weak voltage signal VCCSA, and thus the data in the memory cell will be stable without flipping.

For further understanding of the instant disclosure, reference is made to the following detailed description illustrating the embodiments and examples of the instant disclosure. The description is for illustrative purpose only and is not intended to limit the scope of the claim.

DETAILED DESCRIPTION OF THE PREFERRED EMBODIMENTS

Figure 1:
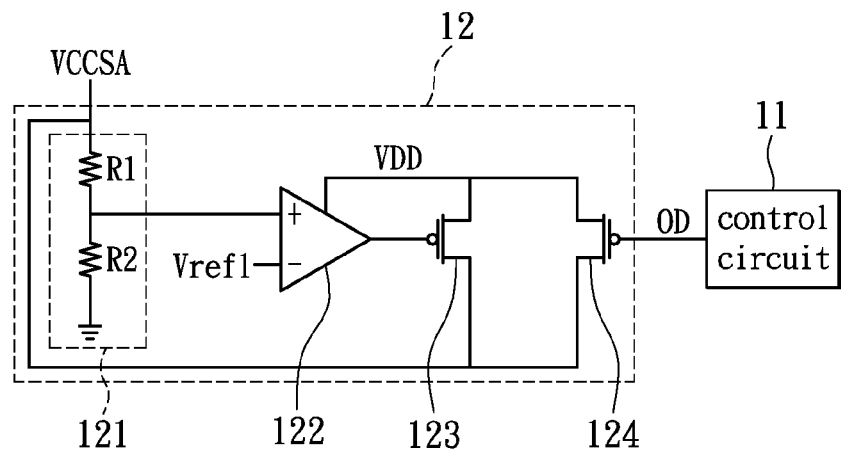
FIG. 1 is a circuit diagram of a voltage regulator according to an exemplary embodiment of the present disclosure.

Please refer to FIG. 1, FIG. 1 is a circuit diagram of a voltage regulator according to an exemplary embodiment of the present disclosure. The voltage regulator 1 comprises a control circuit 11 and an over-drive circuit 12. An in-out end of the over-drive circuit 12 is used to receive and regulate a voltage signal VCCSA output from a sensing amplifier in a DRAM circuit.

The over-drive circuit 12 is electrically connected to the control circuit 11. The control circuit 11 receives a sense signal Sense_Sig, and outputs an over-drive signal OD to the over-drive circuit 12 according to the sense signal Sense_Sig, wherein the sense signal Sense_Sig is asserted when the bit line is sensed that the restoring operation is performed. The over-drive circuit 12 regulates the voltage signal VCCSA according the over-drive signal OD.

The over-drive signal OD goes down to a voltage level depending on VDD when the sense signal Sense_Sig is asserted but has not been asserted for the delay time (i.e. the over-drive duration) Δt. That is, the over-drive signal OD goes down to a voltage level from the current level of VDD for the delay time Δt merely when the sense signal Sense_Sig begins to be asserted.

Figure 2:
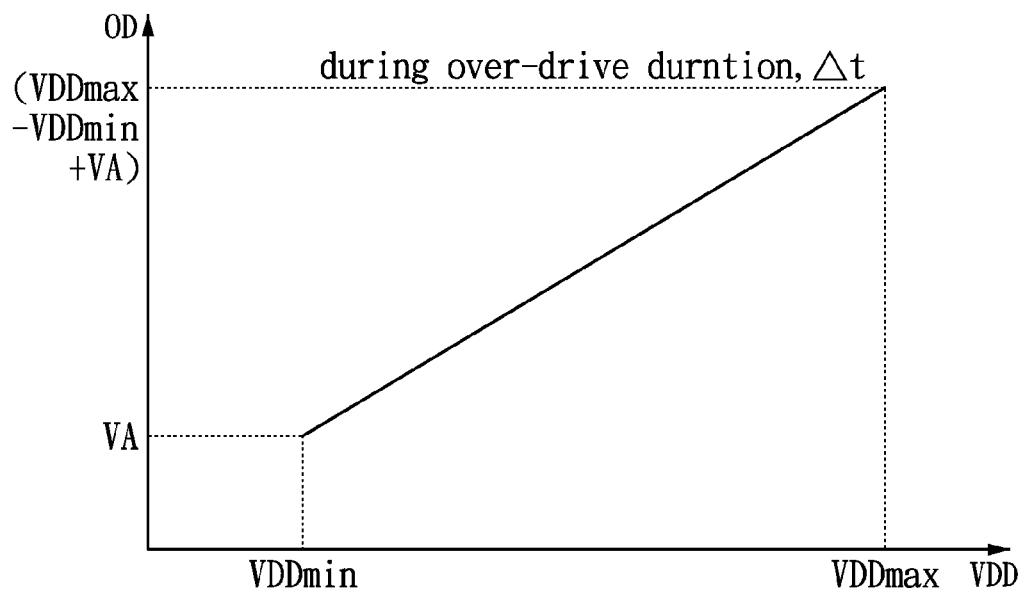
FIG. 2 is a curve diagram showing a relation between an over-drive signal and an external power when the sense signal is asserted but has not been asserted for a delay time according to an exemplary embodiment of the present disclosure.

Please refer to FIG. 2, FIG. 2 is a curve diagram showing a relation between an over-drive signal and an external power when the sense signal is asserted but has not been asserted for a delay time according to an exemplary embodiment of the present disclosure. The over-drive signal OD is proportional to the external power VDD (i.e. the over-drive signal OD rises up along with the external power VDD) when the sense signal Sense_Sig is asserted but has not been asserted for a delay time Δt. During the delay time Δt, if the over-drive signal OD is designed at a level VA along with the external power VDD at the level VDDmin, the over-drive signal is at the level (VDDmax−VDDmin+VA) when the level the external power VDD equals to the level VDDmax.

Back to refer FIG. 1, the implementation of the over-drive circuit is illustrated as follows. The over-drive circuit 11 comprises a voltage divider 121, a comparator 122, a first PMOS transistor 123, and a second PMOS transistor 124. An input end of the voltage divider 121 receives the voltage signal VCCSA, and an output end of the voltage divider 121 is electrically connected to a positive input end of the comparator 122. A negative input end of the comparator 122 receives a reference voltage signal Vref1, an output end of the comparator 122 is electrically connected to a gate of the PMOS transistor 123, and a power end of the comparator receives the external power VDD. Sources of the first PMOS transistor 123 and the second PMOS transistor 124 receives the external power VDD, a gate of the second PMOS transistor 124 receives the over-drive signal OD, and drains of the first PMOS transistor 123 and the second PMOS transistor 124 are electrically connected to the voltage signal VCCSA.

The voltage divider 121 outputs a divided voltage signal according to the received voltage signal VCCSA. The voltage divider 121 for example has two serially connected resistors R1 and R2, wherein the voltage signal VCCSA is electrically connected to an end of the resistor R1, and an end of the resistor R2 is grounded, such that an end connected between the resistors R1 and R2 is used to output the divided voltage signal. The comparator 122 compares the divided voltage signal and the reference voltage signal Vref1, and correspondingly outputs a comparison signal to the gate of the first PMOS transistor 123. When the voltage signal VCCSA falls down to make the level of the divided signal is less than the level of the reference voltage signal Vref1, the first PMOS transistor 123 is turned on, and the external power VDD helps the VCCSA to rise up.

The over-drive mechanism of the over-drive circuit 11 is stated as follows. The over-drive circuit 11 over-drives (pulls up) the voltage signal VSSCA when the over-drive signal OD is lower than a threshold voltage Vth of the second PMOS transistor 124. To put it concretely, when the sense signal Sense_Sig is deasserted or has been asserted for a delay time Δt, the over-drive signal OD rises up to the external power VDD, and the second PMOS transistor 124 is turned off.

When the sense signal Sense_Sig is asserted for the delay time, the over-drive signal OD falls down from the current level dependent on the level of the external power VDD. The falling time td that the over-drive signal OD falls down to the threshold voltage Vth from the current level is depends on the level of the external power VDD, and that is, the higher the level of the external power VDD is, the longer the falling time td is, and the later the over-drive circuit 11 over-drives the voltage signal VSSCA (i.e. the later the second PMOS transistor 124 is turned on). Therefore, the over-drive circuit 12 begins to over-drive the voltage signal VCCSA when the over-drive signal OD falls down to be less than the threshold voltage from the current level thereof, such that it prevents from the too weak voltage signal VCCSA. To sum up, the voltage regulator 1 helps the sensing amplifier to provide the stable voltage signal VCCSA to prevent the data from flipping.

Figure 3:
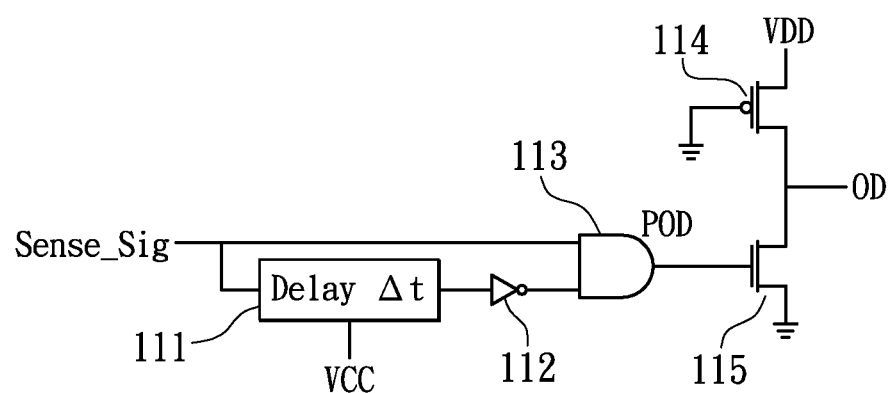
FIG. 3 is a circuit diagram of a control circuit of a voltage regulator according to an exemplary embodiment of the present disclosure.

Please refer to FIG. 3, FIG. 3 is a circuit diagram of a control circuit of a voltage regulator according to an exemplary embodiment of the present disclosure. The implementation of the control circuit 11 is illustrated as follows. The control circuit 11 comprises a delay unit 111, an inverter 112, an AND gate 113, a first NMOS transistor 115, and a third PMOS transistor 114. An input end of the delay unit 111 receives the sense signal Sense_Sig, a power end of the delay unit 111 receives a constant internal voltage VCC, and an output end of the delay unit 111 is electrically connected to an input end of the inverter 112. An output end of the inverter 112 is electrically connected to one input end of the AND gate 113, and another one input end of the AND gate 113 receives the sense signal Sense_Sig. An output end of the AND gate 113 is electrically connected to a gate of the first NMOS transistor 115. A drain of the first NMOS transistor 115 is electrically connected to a drain of the third PMOS transistor 114 to output the over-drive signal OD, and a source of the first NMOS transistor 115 and a gate of the third PMOS transistor 114 are grounded. A source of the third PMOS transistor 114 receives the external power VDD.

The delay unit 111 delays the sense signal Sense_Sig a delay time Δt to output a delayed sense signal, wherein the delay time is determined according to the received constant internal voltage VCC. The inverter 112 inverts the delay sense signal to output an inverted delayed sense signal. The AND gate 113 performs an logic AND operation on the sense signal Sense_Sig and the inverted delayed sense signal to output a pulse over-drive signal POD. The over-drive signal is determined according to the pulse over-drive signal POD.

The driving ability of the first NMOS transistor 115 is larger than the third PMOS transistor 114. The third PMOS transistor 114 is turned on since the gate of the third PMOS transistor 114 is grounded. The over-drive signal OD is equal to the external power VDD when the pulse over-drive signal POD is deasserted, but goes down to a when the pulse over-drive signal POD is asserted. The pulse over-drive signal POD is asserted when the sense signal Sense_Sig is asserted but has not been asserted for the delay time Δt, and is deasserted when the sense signal Sense_Sig is deasserted or has been asserted for a delay time Δt.

Figure 4:
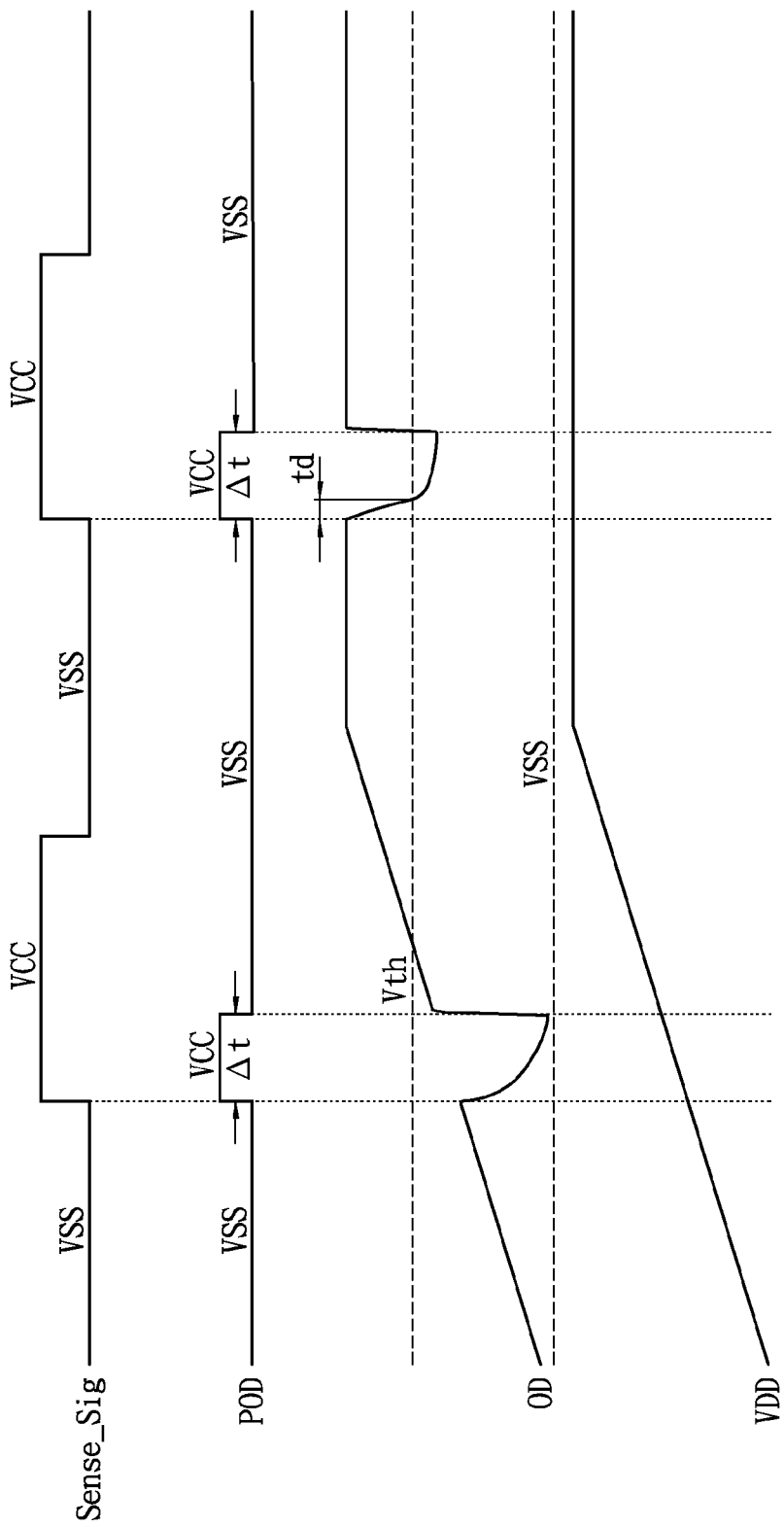
FIG. 4 is a wave diagram showing a sensing signal, a pulse over-drive signal, an over-drive signal, and an external power.

Please refer to FIG. 1, FIG. 3, and FIG. 4, FIG. 4 is a wave diagram showing a sensing signal, a pulse over-drive signal POD, an over-drive signal, and an external power. When the sense signal Sense_Sig is deasserted (i.e. at the level of the voltage signal VSS), the pulse over-drive signal POD is thus deasserted (i.e. at the level of the voltage signal VSS), and the over-drive signal OD rises up along with the external power VDD.

When the sense signal Sense_Sig is asserted (i.e. at the level of the constant internal voltage VCC) but has not been asserted for the delay time Δt, the pulse over-drive signal POD is asserted. The pulse over-drive signal POD is asserted merely for the delay time Δt when the sense signal Sense_Sig begins to be asserted. When the pulse over-drive signal POD is asserted, the over-drive signal OD falls down a voltage level. For example, the over-drive signal OD is at the level VA when the external power VDD is at the level VDDmin; and the over-drive signal OD will be at the level (VDDmax-VDDmin+VA), when the external power VDD is at the level VDDmax.

When the over-drive signal OD rises up to be larger than the threshold voltage Vth of the second PMOS transistor 124 of FIG. 1, the second PMOS transistor 124 is turned off, and the over-drive circuit 12 stops over-driving the voltage signal VCCSA. When the external power VDD is too low, the over-drive circuit 12 continuously over-drives the voltage signal VCCSA to prevent from the too weak voltage signal VCCSA.

Furthermore, it is noted that when the pulse over-drive signal POD is asserted, the over-drive signal OD falls down to the level of the voltage signal VSS from the current level dependent on the level of the external power VDD. The falling time td that the over-drive signal OD falls down to the threshold voltage Vth from the current level is depends on the level of the external power VDD, and that is, the higher the level of the external power VDD is, the longer the falling time td is, and the later the over-drive circuit 11 over-drives the voltage signal VSSCA (i.e. the later the second PMOS transistor 124 is turned on). Thus, if the external power VDD is too strong, the over-drive circuit 12 will over-drives the voltage signal VCCSA later to prevent from the too strong voltage signal VCCSA.

According to the illustrated embodiment, a voltage regulator for providing a stable voltage signal VCCSA is provided. The voltage regulator can prevent the too strong or weak voltage signal VCCSA, and thus the data in the memory cell will be stable without flipping.

Although the present disclosure has been described in considerable detail with reference to certain preferred embodiments thereof, the disclosure is not for limiting the scope of the disclosure. Persons having ordinary skill in the art may make various modifications and changes without departing from the scope and spirit of the disclosure. Therefore, the scope of the appended claims should not be limited to the description of the preferred embodiments described above.

What is claimed is:
1. A voltage regulator, comprising:
an over-drive circuit, for receiving a first voltage signal output from a sensing amplifier in a DRAM circuit, and regulating the first voltage signal according to an over-drive signal; and
a control circuit, electrically connected to the over-drive circuit, for receiving a sense signal, and outputting the over-drive signal according to the sense signal, wherein the sense signal is asserted when a bit line in the DRAM circuit is sensed that an restoring operation is performed;
wherein the over-drive signal goes down to a level of a second voltage signal from a current level thereof dependent on an external power merely when the sense signal is asserted but has not been asserted for a delay time, or otherwise, the over-drive signal is equal to the external power;
wherein the over-drive circuit comprising:
a voltage divider, for outputting a divided voltage signal according to the first voltage signal;
a comparator, for comparing the divided voltage signal and a reference voltage signal to output a comparison signal;
a first PMOS transistor, a gate thereof receives the comparison signal, a source thereof is electrically connected to the external power, and a drain thereof is electrically connected to the first voltage signal; and
a second PMOS transistor, a gate thereof receives the over-drive signal, a source thereof is electrically connected to the external power, and a drain thereof is electrically connected to the first voltage signal.

2. The voltage regulator according to claim 1, wherein the over-drive signal is proportional to the external power when the sense signal is deasserted or the sense signal has been asserted for the delay time.

3. The voltage regulator according to claim 1, wherein the delay time is determined according to a constant internal voltage.

4. The voltage regulator according to claim 1, wherein the over-drive circuit over-drives the first voltage signal when the over-drive signal is less than a threshold voltage.

5. The voltage regulator according to claim 4, wherein the over-drive circuit stops over-driving the first voltage signal when the over-drive signal rises up to be larger than the threshold voltage.

6. The voltage regulator according to claim 4, wherein after the over-drive signal falls down to be less than the threshold voltage from the current level thereof, the over-drive circuit over-drives begins to over-drive the first voltage signal.

7. The voltage regulator according to claim 2, wherein the larger the external power is, the longer a falling time that the first voltage signal falls down to the threshold voltage from the current level thereof is.

8. The voltage regulator according to claim 1, wherein the voltage divider comprising:
a first resistor, one end thereof is electrically connected to the first voltage signal; and
a second resistor, one end thereof is grounded;
wherein an end connected between the first resistor and the second resistor is used to output the divided voltage signal.

9. The voltage regulator according to claim 1, wherein the control circuit comprising:
a delay unit, for delaying the sense signal the delay time to output the delayed sense signal; and
an inverter, for inverting the delayed sense signal to output an inverted delayed sense signal;
an AND gate, for performing a logical AND operation on the sense signal and the delayed sense signal to output a pulse over-drive signal;
a first NMOS transistor, a gate thereof receives the pulse over-drive signal, and a source thereof is grounded;
a third PMOS transistor, a gate thereof is grounded, and a source thereof is electrically connected the external power;
wherein drains of the first NMOS transistor and the third PMOS transistor are electrically connected to each other to output the over-drive signal, and a driving ability of the first NMOS transistor is larger than a driving ability of the third PMOS transistor.

10. The voltage regulator according to claim 9, wherein the pulses over-drive signal is asserted when the sense signal is asserted but has not been asserted for the delay time, or otherwise, the pulse over-drive signal is deasserted.

11. The voltage regulator according to claim 10, wherein the pulses over-drive signal is deasserted when the sense signal is deasserted or the sense signal has been asserted for the delay time.

12. The voltage regulator according to claim 9, wherein when the pulse over-drive signal is asserted, the over-drive signal falls down to the level of the second voltage signal from the current level thereof.

13. The voltage regulator according to claim 9, wherein when the pulse over-drive signal is deasserted, the over-drive signal is equal to the external power.

* * * * *